(12) United States Patent  
Koenig et al.

(10) Patent No.: US 8,976,829 B2  
(45) Date of Patent: Mar. 10, 2015

(54) EDGE-EMITTING SEMICONDUCTOR LASER

(75) Inventors: Harald Koenig, Bernhardswald (DE);  
Uwe Strauss, Bad Abbach (DE);  
Wolfgang Reill, Pentling (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 129 days.

(21) Appl. No.: 13/695,249

(22) PCT Filed: May 9, 2011

(86) PCT No.: PCT/EP2011/057415  
§ 371 (c)(1),  
(2), (4) Date: Feb. 5, 2013

(87) PCT Pub. No.: WO2011/141421  
PCT Pub. Date: Nov. 17, 2011

(65) Prior Publication Data  
US 2013/0128909 A1    May 23, 2013

(30) Foreign Application Priority Data

May 14, 2010   (DE) .......................... 10 2010 020 625

(51) Int. Cl.  
*H01S 5/30* (2006.01)  
*H01L 33/00* (2010.01)  
*H01S 5/042* (2006.01)  
*H01S 5/40* (2006.01)  
*H01S 5/02* (2006.01)  
*H01S 5/028* (2006.01)  
*H01S 5/0625* (2006.01)  
*H01S 5/16* (2006.01)  
*H01S 5/20* (2006.01)  
*H01S 5/22* (2006.01)

(52) U.S. Cl.  
CPC ................. *H01S 5/30* (2013.01); *H01S 5/0425* (2013.01); *H01S 5/4031* (2013.01); *H01L 33/005* (2013.01); *H01S 5/0201* (2013.01); *H01S 5/0283* (2013.01); *H01S 5/0625* (2013.01); *H01S 5/16* (2013.01); *H01S 5/2036* (2013.01); *H01S 5/22* (2013.01); *H01L 2924/0002* (2013.01)  
USPC .......................................... 372/44.01; 438/33

(58) Field of Classification Search  
USPC .................................. 372/43.01, 44.01, 49.01  
See application file for complete search history.

(56) References Cited

U.S. PATENT DOCUMENTS 4,694,459 A     9/1987   Burnham et al.  
(Continued)

FOREIGN PATENT DOCUMENTS

CN          1886875 A    12/2006  
DE     197 08 385 A1     9/1998  
(Continued)

*Primary Examiner* — Armando Rodriguez  
(74) *Attorney, Agent, or Firm* — Slater & Matsil, L.L.P.

(57) ABSTRACT

An edge-emitting semiconductor laser is specified. A semiconductor body includes an active zone suitable for producing electromagnetic radiation. At least two facets on the active zone form a resonator. At least two contact points are spaced apart from one another in a lateral direction by at least one intermediate region and are mounted on an outer face of the semiconductor body.

16 Claims, 4 Drawing Sheets

(56) References Cited

U.S. PATENT DOCUMENTS

| | | | |
|---|---|---|---|
| 4,881,237 A * | 11/1989 | Donnelly | 372/50.12 |
| 5,561,682 A | 10/1996 | Aoki et al. | |
| 6,208,793 B1 | 3/2001 | Hillmer et al. | |
| 6,618,409 B1 * | 9/2003 | Hu et al. | 372/43.01 |
| 7,474,682 B2 * | 1/2009 | Mizuuchi et al. | 372/46.01 |
| 2003/0231681 A1 | 12/2003 | Ungar | |
| 2011/0188530 A1 | 8/2011 | Lell et al. | |

FOREIGN PATENT DOCUMENTS

| | | |
|---|---|---|
| DE | 10 2008 014 092 A1 | 7/2009 |
| DE | 10 2008 012 859 A1 | 11/2009 |
| EP | 1 460 742 A2 | 9/2004 |
| EP | 1 710 876 A1 | 10/2006 |
| EP | 1 713 150 A2 | 10/2006 |
| JP | 01-251686 A | 10/1989 |
| WO | WO 2009/082999 A2 | 7/2009 |

* cited by examiner

EDGE-EMITTING SEMICONDUCTOR LASER

This patent application is a national phase filing under section 371 of PCT/EP2011/057415, filed May 9, 2011, which claims the priority of German patent application 10 2010 020 625.3, filed May 14, 2010, each of which is incorporated herein by reference in its entirety.

TECHNICAL FIELD

An edge-emitting semiconductor laser and a method of producing an edge-emitting semiconductor laser are specified.

SUMMARY OF THE INVENTION

In one aspect, an edge-emitting semiconductor laser has an optical output power that is adjustable. In a further aspect, a simple and efficient method of producing an edge-emitting semiconductor laser is provided.

According to at least one embodiment of the edge-emitting semiconductor laser, the latter comprises a semiconductor body, which comprises at least one active zone suitable for generating electromagnetic radiation. For example, the semiconductor body comprises a substrate, on which a semiconductor layer sequence is grown epitaxially. The semiconductor body may also comprise a plurality of active zones, which are arranged one above the other in the vertical direction. In this context "vertical direction" means a direction perpendicular to the epitaxially grown semiconductor layer sequence. The active zones are then arranged one above the other "in a stack" and may then form a "stacked" laser structure.

The active zone may comprise a layer which emits radiation in the range from ultraviolet to infrared light. The active zone preferably comprises a pn-junction, a double heterostructure, a single quantum well (SQW) structure or a multi quantum well (MQW) structure for radiation generation. The term quantum well structure does not here have any meaning with regard to the dimensionality of the quantisation. It thus encompasses, inter alia, quantum troughs, quantum wires and quantum dots and any combination of these structures.

According to at least one embodiment of the edge-emitting semiconductor laser, the latter comprises at least two facets on the active zone, which form a resonator. Facet is here understood to be a smooth boundary surface. "Smooth" here means that the surface roughness of the facet, in particular in the region of the active zone and wave guidance, is markedly less than the wavelength of the light to be generated by the edge-emitting semiconductor laser when in operation, preferably less than half the wavelength, particularly preferably less than a quarter of the wavelength. The at least two facets extend in the vertical direction and therefore define the active zone in the lateral direction, thus in one direction of emission of the semiconductor laser. In other words, the active zone is arranged in the lateral direction between the at least two facets. The facets form side faces of the semiconductor body of the edge-emitting semiconductor laser. "Lateral direction" here means a direction parallel to the epitaxially grown semiconductor layer sequence. Preferably, the two facets of the edge-emitting semiconductor laser lie on mutually opposing sides of the semiconductor body. If the semiconductor laser is surrounded for example by air or another material with a lower optical refractive index than the refractive index of the active zone, the electromagnetic radiation generated by the active zone may be partially reflected at the facet/air boundary surface. If the two facets are then on mutually opposing sides of the semiconductor body, the two facets form an optical resonator. The lateral direction preferably extends parallel to a resonator axis of the resonator formed by the facets. Some of the electromagnetic radiation generated by the active zone may then be coupled out of the semiconductor laser by means of at least one of the facets.

According to at least one embodiment of the edge-emitting semiconductor laser, the latter comprises at least two contact points spaced from one another in the lateral direction by at least one intermediate zone, said contact points being mounted on an outer face of the semiconductor body. The contact points are preferably arranged on the same side of the semiconductor body. In a plan view of the edge-emitting semiconductor laser, the intermediate zone is defined by two contact points adjoining one another in the lateral direction and for example the outer face of the semiconductor body facing the contact points. In other words, the contact points are each separated from one another by an intermediate zone. The intermediate zones separated from one another in the lateral direction are thus located between the facets of the edge-emitting semiconductor laser in the lateral direction. Two, four, eight or more contact points are for example arranged on the outer face. In other words, the number of contact points in the lateral direction determines the length of the resonator.

The contact points serve in electrical contacting of the semiconductor laser and, with external electrical contacting, preferably form an electrical contact of the same electrical potential. The contact points are for example a positive terminal of the edge-emitting semiconductor laser. For electrical contacting, the contact points may be in direct contact with the semiconductor body. For example, the intermediate zones are not electrically conductive or contactable.

Preferably, intermediate zones and contact points alternate over the entire length of the resonator, so resulting in the connection region of the laser being structured into contact points and intermediate zones even in the middle of the resonator.

In plan view of the semiconductor laser, the contact points for example each exhibit the same basic geometric shape. It is feasible for the contact points to be rectangular, square, oval, circular or ellipsoidal. The edges of the contact points may in this case comprise further, smaller structures. According to at least one embodiment of the edge-emitting semiconductor laser, the semiconductor laser comprises a semiconductor body, the semiconductor body comprising at least one active zone suitable for generating electromagnetic radiation. The semiconductor laser further comprises at least two facets on the active zone, which form a resonator. At least two contact points spaced from one another in the lateral direction by at least one intermediate zone are mounted on an outer face of the semiconductor body.

The edge-emitting semiconductor laser described herein is based, inter alia, on the recognition that output power may be determined by the arrangement and external finish of contact points of the semiconductor laser. If for example an edge-emitting semiconductor laser is contacted electrically via a single contact point which is continuous and contiguous in the lateral direction, the disadvantage arises that the contact surface forming between such a contact point and a semiconductor body of the semiconductor laser can only be fully electrically contacted, i.e., over the entire extent of such a contact surface. If such a contact point extends continuously between two facets forming a resonator of the semiconductor laser, the active zone of the semiconductor laser cannot be individually energized by such a contact point by way of the size and structure of the contact surface. The optical output power of the edge-emitting semiconductor laser is therefore controllable via the single electrical contact point only for example at the level of absolute energization or voltage.

In order then to individually adjust and adapt the optical output power and aperture of the semiconductor laser, the semiconductor laser described herein makes use of the concept of mounting at least two contact points spaced from one another in the lateral direction by at least one intermediate zone on an outer face of the semiconductor body. Depending on individual requirements it is then possible to contact externally electrically one, a plurality of or all of the contact points spaced from one another in the lateral direction. Depending on the number or arrangement of the electrically contacted contact points, the active zone may be individually energized, whereby the optical output power may also be adapted to particular requirements by way of the size and/or the extent of the contact surface.

According to at least one embodiment, the contact points are mutually independently contactable and/or energizable. It is advantageously possible not just to energize and contact a pre-determinable number of contact points, the independent energizability also makes it possible to energize each of the contact points with different current intensities. In this respect, different current intensities, which may be superimposed in the semiconductor body, may be combined with different contacting patterns.

According to at least one embodiment, the edge-emitting semiconductor laser comprises a plurality of contact points arranged in the manner of a matrix, which are mounted on the outer face of the semiconductor body and are arranged spaced from one another both in the lateral direction and in a transverse direction extending perpendicular to the lateral direction respectively by intermediate zones.

In this context "in the manner of a matrix" means that the plurality of contact points are preferably mounted in the form of rows and columns on the outer face of the semiconductor body. In this case, the contact points do not absolutely have to be mounted in a regular grid on the outer face of the semiconductor body.

Both the lateral direction and the transverse direction extending perpendicular to the lateral direction lie in a common plane, which extends parallel to the epitaxially grown semiconductor layer sequence. Like the intermediate zones which space the contact points from one another in the lateral direction, those intermediate zones which space the contact points from one another in the transverse direction are defined, in a plan view of the outer face of the semiconductor body, for example by side faces of two contact points adjoining one another in the transverse direction and the outer face of the semiconductor body facing the contact points. The contact points are for example arranged in a 2×2, 4×4, 8×8 or larger matrix. In other words, the number of contact points in the transverse direction determines the width of the semiconductor body and thus of the active zone. The number of contact points arranged in the transverse direction may therefore define or modulate an emission area and thus likewise an optical output power. It is feasible in this context for just every second contact point to be electrically contacted both in the lateral and in the transverse direction. Any other desired contacting patterns, which may be modified as required, are likewise also conceivable.

According to at least one embodiment, at least one structuring trench is introduced into the semiconductor body in the region between contact points adjacent in the transverse direction, wherein in the region of the structuring trench parts of the semiconductor body are removed completely at least in places and the structuring trench does not extend in the vertical direction as far as the active zone. For example, the structuring trench extends continuously and contiguously in the lateral direction between the two facets. In other words, the structuring trench then forms a contiguous area. In particular, the at least one structuring trench comprises a bottom face opposite the mouth of the structuring trench and two side faces, which are joined together by the bottom face. Both the side faces and the bottom face are then formed completely by the semiconductor layer sequence. The structuring trench is thus for example a recess in the semiconductor layer sequence. The contact elements are preferably adjoined on both sides in the transverse direction by in each case one or more structuring trenches. In other words, the laterally arranged contact elements and the two structuring trenches may then extend parallel to one another. The structuring trenches arranged on both sides next to the contact elements in the transverse direction thus form a broad stripe laser or ridge laser. A ridge width, i.e., the extent of the semiconductor body in the transverse direction directly beneath the contact elements, is then the respective ridge width of the semiconductor laser.

Since the structuring trench does not extend in the vertical direction as far as the active zone, the structuring trench does not interrupt the active zone, but rather merely structures the semiconductor material of the semiconductor body lying between the contact surfaces and the active zone.

According to at least one embodiment, the edge-emitting semiconductor laser comprises at least one further trench, which is arranged between at least two blocks with in each case a plurality of contact points adjacent in the transverse direction. The further trench preferably has a thickness of at least 30 μm.

According to at least one embodiment, with external energization of at least two contact points adjacent in the lateral direction, regions of the active zone not overlapping with the contact points in the vertical direction are energized with at least 0.3 times the maximum energization density jmax of the active zone. The energization density is preferably above a laser excitation threshold of the active zone within the non-overlapping regions. Such a minimum energization density of regions of the active zone not overlapping with the contact points in the vertical direction ensures that the active zone exhibits neither energization gaps nor for example abrupt energization density differences along the active zone in the lateral direction. In other words, although the contact points spaced in the lateral direction allow adjustment of an energization profile, this is however preferably continuous, i.e., it extends in the lateral direction without steps or interruptions.

According to at least one embodiment, the spacing between two contact points adjacent in the lateral direction is at most the maximum lateral extent of the contact points. In this context, "maximum lateral extent" means the maximum extent of the contact points in the lateral direction. By selecting maximum spacing of the contact points in this way, a contact point contact surface sufficient for energizing the active zone is provided for energizing the active zone.

According to at least one embodiment, the contact points are arranged in the lateral direction with equal and/or regular spacing relative to one another on the outer face of the semiconductor body. This may mean that the spacing of the intermediate zones is constant over the entire lateral extent of the semiconductor body.

According to at least one embodiment, the contact points are arranged on the outer face of the semiconductor body with a spacing varying periodically in the lateral direction. For example, two spacings of different magnitudes alternate in the lateral direction.

According to at least one embodiment, the maximum lateral extent of the contact points is constant. If the contact points are for example rectangular, at least one edge length of the contact points, which extends parallel to the lateral direction, is equal for each of the contact points. In addition, the contact points may in each case be identical in further or all geometric dimensions. For example, all the contact points may have the same area in plan view.

According to at least one embodiment of the edge-emitting semiconductor laser, an ohmic contact layer is arranged at least in places in the vertical direction between the contact points and the semiconductor body. The ohmic contact layer serves in contacting the contact points electrically with the semiconductor body. The ohmic contact layer is preferably formed with a metallic material. For example, the ohmic contact layer is applied to the outer face of the semiconductor body. The electrical resistance provided by the ohmic contact layer therefore enables the contact points to be contacted electrically with the semiconductor body.

According to at least one embodiment, the maximum vertical extent is constant in the lateral direction for each of the contact points. In this context, "maximum vertical extent" means the maximum extent of the contact points in the vertical direction. It is then conceivable for the contact points to be identical to one another in all geometric dimensions. For example, the contact points are cuboidal or cubic in form.

According to at least one embodiment, the ohmic contact layer contains at least one of the materials Ti, Cr, Pt, Pd. The stated materials have proven to be very particularly advantageous for forming an ohmic contact layer or an electrical resistor between the contact points and the semiconductor body.

According to at least one embodiment, a wetting layer is applied at least in places to the ohmic contact layer. The wetting layer is for example applied to the entire ohmic contact layer. In addition, the wetting layer may also be applied directly to the semiconductor material of the semiconductor body, for example in the region of the intermediate zones. At these points no ohmic contact layer is then located for example between the wetting layer and the semiconductor body. The wetting layer may be formed with silver and/or gold. It is likewise conceivable for the wetting layer to be formed with further metallic materials and/or electrically conductive materials.

Advantageously, the wetting layer allows wetting with a solder material, such that the contact points can be soldered mechanically firmly to the wetting layer by means of the solder material.

According to at least one embodiment, the thickness of the wetting layer amounts to at most a quarter, preferably at most a tenth, of the maximum vertical extent of the contact points.

The sum of the thicknesses of ohmic contact layer and wetting layer is preferably at most 1 µm, for example 500 nm.

According to at least one embodiment, at least one passivation layer is applied at least in places to at least one facet, which passivation layer contains at least one of the materials silicon dioxide, silicon nitride, titanium dioxide, aluminium dioxide, silicon. This means that the passivation layer is in direct contact with the facet. For example, a passivation layer consisting completely of one of the stated materials is applied to the one facet of the semiconductor body. It is additionally possible for different layers of the stated material to be applied alternately to a facet of the semiconductor body. Preferably, one or more of the stated passivation layers are applied to all exposed points of the active zone. It is likewise conceivable for a passivation layer likewise to be applied to further exposed points of the semiconductor body, for example in the region of a structuring trench, and exposed points of the ohmic contact layer.

A method of producing an edge-emitting optoelectronic semiconductor laser is additionally provided. For example, the method may be used to produce an edge-emitting semiconductor laser as described in relation to one or more of the above-stated embodiments. This means that the features listed for the semiconductor lasers described herein are also disclosed for the method described herein and vice versa.

In a first step for producing an edge-emitting semiconductor laser, a semiconductor body is provided, the semiconductor body comprising at least one active zone suitable for generating electromagnetic radiation.

In a further step, a plurality of contact points arranged in the manner of a matrix are mounted on an outer face of the semiconductor body, the contact points being arranged spaced from one another by intermediate zones both in the lateral direction and in a transverse direction extending perpendicular to the lateral direction.

In a further step, at least two facets are produced on the active zone by severing the semiconductor body along severing lines extending in the transverse direction to yield individual edge-emitting semiconductor lasers, the severing lines not extending through each of the intermediate zones. This means that in the lateral direction there is at least one intermediate zone through which no dividing line extends and thus at points of the semiconductor body which overlap with such an intermediate zone in the vertical direction, the semiconductor body is not severed.

The at least two facets are preferably produced by scribing or breaking. Scribing is preferably performed mechanically or by means of a focused laser beam. On scribing, crack nucleation may start in the semiconductor material for example in the vertical direction. A subsequent breaking process breaks the semiconductor material into individual semiconductor lasers, for example in the form of laser bars, so producing fracture surfaces at the side faces of the semiconductor lasers. The fracture surfaces then form the facets. Alternatively, the at least two facets may be produced by wet or dry chemical etching processes. If the facet is produced by sawing for example, it may then be smoothed by means of polishing or grinding. Preferably, at least two facets are formed, which form mutually opposing, preferably plane parallel side faces of the semiconductor body, such that together with the facets the optical active zone forms a resonator.

If edge-emitting semiconductor lasers are produced for example by severing contact points, this is however associated with the disadvantage that for example the metallic material of the contact points may lead to material overhangs at the facets as a result of singulation through such contact points, the facets thus suffering impairment to their surface finish, for example. In this respect, such damage at the facets caused by singulation of a continuous contact point may impair the optical output power and/or service life of the edge-emitting semiconductor laser.

Such marginal damage may be avoided by "setting back" the contact points from the subsequent facets in the lateral direction. In this way, although severing is at these points performed not through the contact points, but rather merely through the semiconductor body, the lateral extent of a semiconductor body is already fixed prior to severing by the lateral extent of the respective contact point.

In order now to provide a method in which, on the one hand, no damage arises for example at the facets of the semiconductor body during severing as a result of metal overhangs at the contact points, and at the same time the lateral extent of a semiconductor laser is not already fixed prior to severing by the extent of the contact points, the method described herein, inter alia, makes use of the idea of arranging a plurality of contact points arranged in the manner of a matrix on an outer face of the semiconductor body, the contact points being arranged spaced by intermediate zones both in the lateral direction and in a transverse direction extending perpendicular to the lateral direction. In a next step, at least two facets are produced on the active zone by severing the semiconductor body along severing lines to yield individual edge-emitting semiconductor lasers, the severing lines not extending through all the intermediate zones. In other words, the semiconductor body may be severed as required along the severing lines, at least one semiconductor laser produced using the method comprising at least two contact points. The method proposed herein is thus advantageously not only particularly economical with material, but also adapted individually to the requirements of the user. For example, the resonator length extending parallel to the lateral direction may thus be adjusted in the case of the edge-emitting semiconductor lasers produced using said method.

According to at least one embodiment of the method, the severing lines extend through every n-th intermediate zone, wherein n>1. If n=2, for example, it is conceivable that edge-emitting semiconductor lasers are produced in which the contact points are arranged in pairs in the lateral direction.

According to at least one embodiment of the method, prior to mounting of the contact points on the outer face of the semiconductor body, at least one diverter structure is introduced into the semiconductor body over the outer face of the semiconductor body in the region of at least one intermediate zone. The diverter structure is for example a recess in the semiconductor body. The diverter structures may advantageously be used during soldering of the contact points onto the outer face of the semiconductor body, for example, to divert or deflect away from a wetting surface between the contact points and the outer face air bubbles or excess solder material which arise as a result of soldering.

According to at least one embodiment, the contact points exhibit a spacing in the lateral direction of at least 15 µm. Such a spacing range allows severing for example by means of mechanical sawing or by means of a focused laser beam. In other words, the width of a sawing track between the contact points may be adjusted by such a spacing.

According to at least one embodiment, prior to severing at least one trench is introduced over the outer face of the semiconductor body between contact points adjacent in the transverse direction, parts of the semiconductor body being removed completely at least in places in the region of the trench and the trench subdividing the active zone in the transverse direction. For example, the trench extends continuously and contiguously in the lateral direction. The trenches preferably each exhibit a width of at least 30 µm. In other words, the trench then forms a contiguous area. In particular, the at least one trench comprises a bottom face opposite the mouth of the trench and two side faces, which are joined together by the bottom face. Both the side faces and the bottom face are then formed completely by the semiconductor body. The trench may thus be a recess in the semiconductor body. Preferably, the trench extends continuously and contiguously in the lateral direction. For example, the trench defines a subsequent extent of the edge-emitting semiconductor laser in the transverse direction, i.e., the laser bar width of the edge-emitting semiconductor laser. In other words, the trench may serve as marking for subsequent severing. For example, the trench is introduced into the semiconductor body by means of milling or of a dry or wet chemical etching method.

According to at least one embodiment, at least one passivation layer is applied at least in places to exposed points of the semiconductor body prior to severing, which layer contains at least one of the materials silicon dioxide, silicon nitride, titanium dioxide, aluminium dioxide and/or silicon. For example, the passivation layer is applied to exposed points of the semiconductor body in the region of the trench. Passivation may likewise be applied completely to all exposed points of the semiconductor body and/or of the ohmic contact layer.

According to at least one embodiment, the semiconductor body is severed along the at least one trench to yield individual edge-emitting semiconductor lasers. In addition to the above-mentioned marking function, the trench advantageously also simplifies severing, since in the region of the trench the semiconductor body is thinner in its vertical extent and due to the vertical extent of the trench severing does not have to be performed through the active zone. In this way, mechanical and/or thermal damage to the active zone caused by severing of the semiconductor body is avoided.

According to at least one embodiment, at least one passivation layer is applied at least in places to fracture surfaces exposed after severing of the semiconductor body, for example the facets of the semiconductor lasers.

BRIEF DESCRIPTION OF THE DRAWINGS

The edge-emitting semiconductor laser described herein and the method described herein are explained in greater detail below with reference to exemplary embodiments and the associated figures.

In the exemplary embodiment and figures, identical or identically acting components are in each case provided with the same reference numerals. The elements shown should not be considered as being to scale, but rather individual elements may be shown exaggeratedly large to assist in understanding.

DETAILED DESCRIPTION OF ILLUSTRATIVE EMBODIMENTS

Figure 1A:
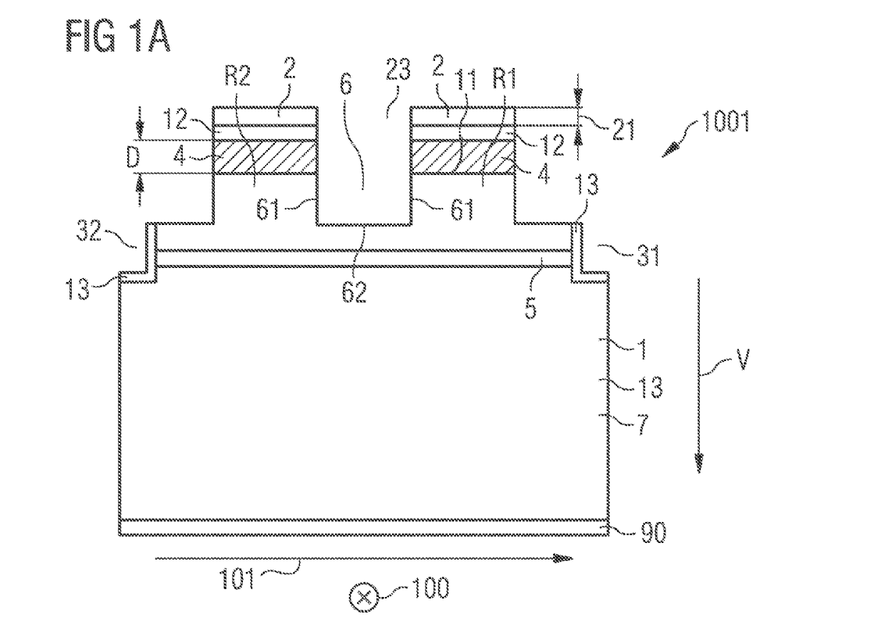
FIGS. 1A to 1C show schematic side and plan views of an exemplary embodiment of an edge-emitting semiconductor laser described herein.

FIG. 1A is a schematic side view in the lateral direction 100 of an edge-emitting semiconductor laser 1001 described herein with a semiconductor body 1. The semiconductor body 1 comprises an active zone 5.

Four contact points 2 are arranged on an outer face 11 in the form of a 2×2 matrix. The contact points 2 are arranged spaced from one another in the lateral direction 100 by intermediate zones 22 in a lateral spacing 222 of 35 µm. In addition, the contact elements 2 are separated in a transverse direction 101 extending perpendicular to the lateral direction 100 by an intermediate zone 23. The edge-emitting semiconductor laser 1001 can be contacted electrically by the contact elements 2 and by a further electrical contact 90 mounted on a surface of the semiconductor body 1 remote from the contact elements 2. For example, the contact elements 2 form a positive terminal and the further electrical contact 90 forms a negative terminal. With electrical contacting the active zone 5 emits electromagnetic radiation in the range from ultraviolet to infrared light.

The edge-emitting semiconductor laser 1001 further comprises two facets 7, which face one another in the lateral direction 100 and form a laser resonator 55 in the region of the active zone 5, electromagnetic radiation being coupled out of the edge-emitting semiconductor laser 1001 via one of the facets 7.

A structuring trench 6 extending continuously and contiguously in the lateral direction 100 is introduced between contact points 2 adjacent in the transverse direction 101, the side faces 61 and a bottom face 62 of which trench are formed completely by the semiconductor body 1. Ridges R1 and R2 are formed in the edge-emitting semiconductor laser 1001 by means of the structuring trench 6. In other words, the edge-emitting semiconductor laser 1001 is a ridge or broad stripe laser.

Steps 31 and 32 are introduced into the semiconductor body 1 in the transverse direction 101, which steps cut through the active zone 5 in the vertical direction V. The steps 31 and 32 extend continuously and contiguously in the lateral direction 100 and therefore define the active zone 5 in the transverse direction 101. At least one passivation layer 13 is applied completely to exposed points of the steps 31 and 32.

An ohmic contact layer 4 is applied to the outer face 11 in the region of the ridges R1 and R2. In the present case the ohmic contact layer 4 contains TiPt or CrPt. In addition, a wetting layer 12 formed with gold is applied to regions of the ohmic contact layer 4 overlapping with the contact points 2 in the vertical direction V. The wetting layer 12 advantageously enables sufficient solder wetting for the contact points 2 to be mounted mechanically firmly and to be readily contactable electrically.

Figure 1B:
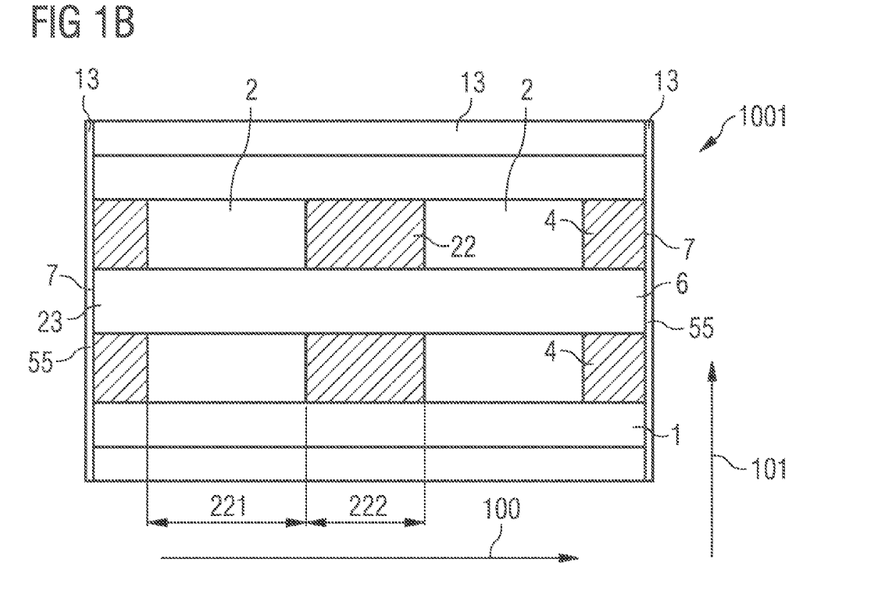

FIG. 1B is a schematic plan view of the semiconductor lasers 1001 of FIG. 1A. The facets 7 facing one another in the lateral direction 100, which together form the laser resonator 55, are again visible. In addition, the passivation layer 13 is applied completely to the facets 7, said passivation layer being formed with at least one of the materials silicon dioxide, silicon nitride, titanium dioxide, aluminium dioxide and/or silicon.

Figure 1C:
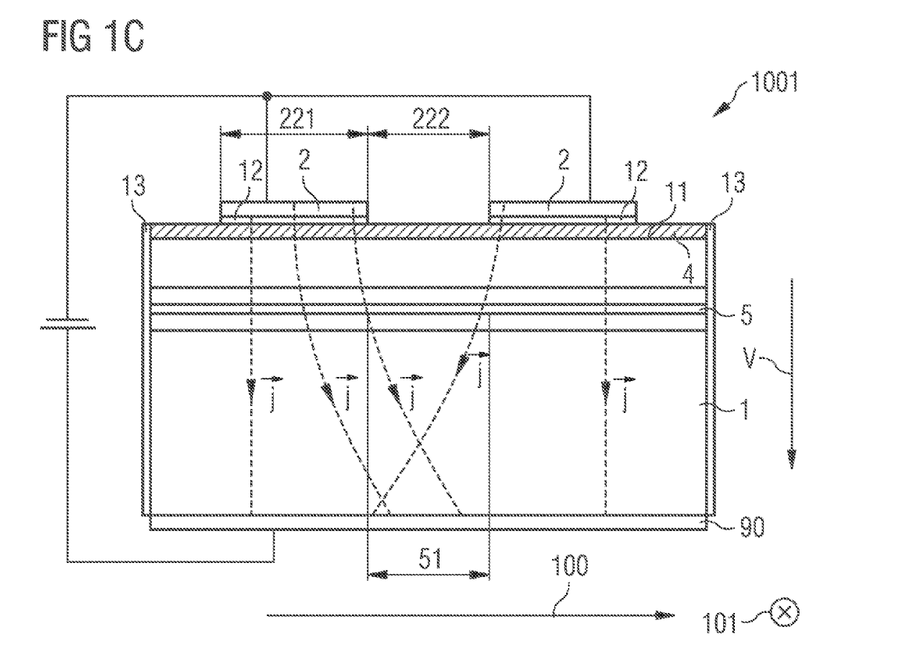

FIG. 1C is a schematic side view in the transverse direction 101 of the edge-emitting semiconductor laser 1001. The figure shows current density axes $\vec{j}$, along which the electric current is guided within the semiconductor body 1. It is apparent that a region 51 of the active zone 5 not overlapping with the contact points 2 in the vertical direction V is less energized. The energization level in the region 51 of the active zone 5 depends for example on the transverse conductivity of the semiconductor material arranged between the active zone 5 and the contact points 2. In the present case, the contact points 2 are arranged such that an energization density j in the region 51 of the active zone 5 amounts to at least 0.5 times a maximum energization density jmax of the active zone 5. The further electrical contact 90 is shown in FIG. 1C as a continuous and contiguous layer. It is likewise conceivable for the further electrical contact 90 to overlap with the contact points 2 in the vertical direction V. The further electrical contact 90 may then be constructed identically to the contact elements 2 and formed with individual, in each case adjacent contact elements.

Figure 1D:
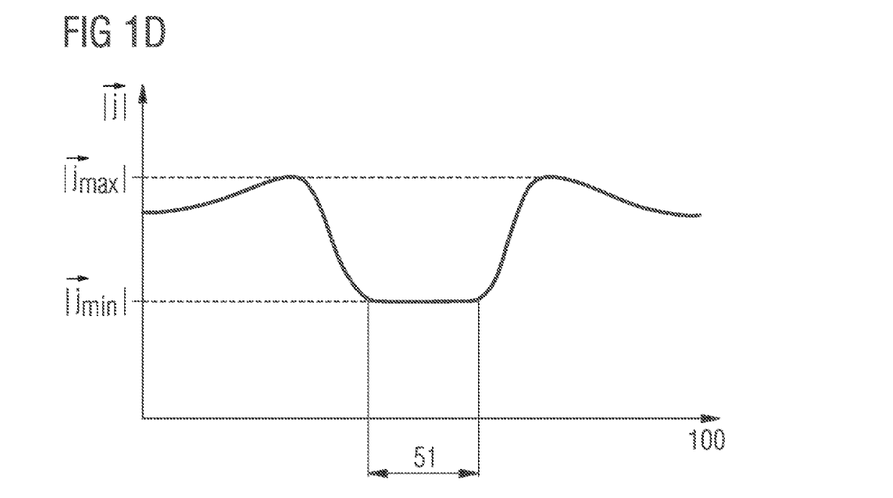
FIG. 1D is a schematic diagram of the current density distribution in an exemplary embodiment of an edge-emitting semiconductor laser described herein.

FIG. 1D shows a schematic diagram of the current density distribution within the semiconductor body 1 along the lateral direction 100 of the edge-emitting semiconductor laser 1001. It is apparent that the active zone 5 is energized with the maximum energization density jmax directly beneath the contact elements 2 in the vertical direction V. In the lateral direction 100 within the region 51 of the active zone 5, the energization density j exhibits a plateau-like minimum jmin, which amounts to half the maximum energization density jmax of the active zone 5. In other words, regions of the active zone 5 which are located directly beneath the contact elements 2 in the vertical direction V are energized best.

A method described herein for producing the edge-emitting semiconductor laser 1001 will be explained in greater detail in connection with the schematic views shown in FIGS. 2A to 2E.

Figure 2A:
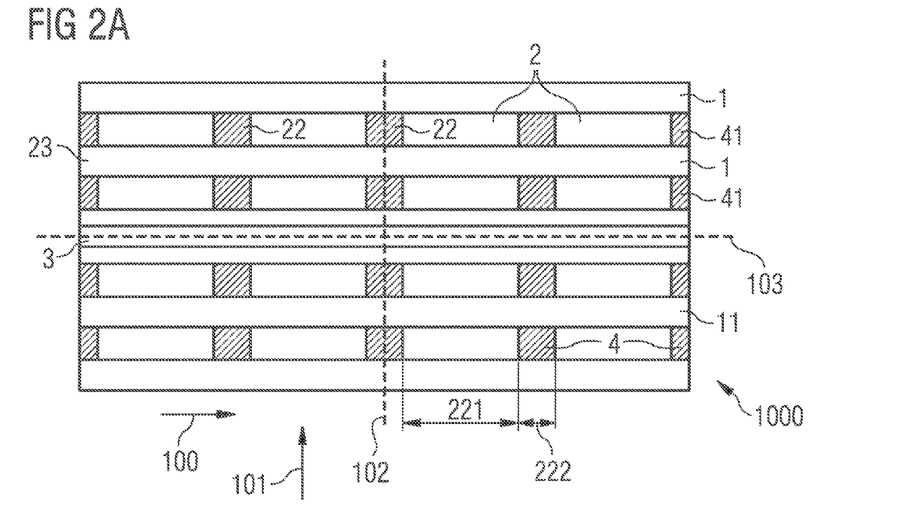
FIGS. 2A to 2E show individual manufacturing steps in different views for producing an exemplary embodiment of an edge-emitting semiconductor laser described herein.

FIG. 2A is a schematic plan view of an assembly 1000 consisting of the semiconductor body 1 and the contact points 2 mounted in the manner of a matrix on the outer face 11. In the present case, the contact points 2 are arranged in the manner of a grid network, each of the contact points 2 being arranged spaced from one another by the intermediate zones 22 in the lateral direction 100 and by the intermediate zones 23 in the transverse direction 101. An ohmic contact layer 4 is arranged in the vertical direction V between the contact points 2 and the semiconductor body 1, which layer is formed by individual stripes 41 separated from one another in the transverse direction 101 in each case by an intermediate zone 23, said stripes each extending continuously and contiguously in the lateral direction 100. In other words in the vertical direction V the contact points 2 are in places congruent with the ohmic contact layer 4. The total thickness D formed with the thickness of the ohmic contact layer 4 together with the thickness of the wetting layer 12 amounts in the present case to at most half the maximum vertical extent 21 of the contact points 2.

In addition, FIG. 2A shows two dividing lines 102 and 103. The dividing line 102 extends continuously in the transverse direction 101 through the intermediate zones 22. The dividing line 103 extends inside and along a trench 3. The trench 3 extends continuously and contiguously in the lateral direction 100 and in the vertical direction V cuts through the active zone 5 of the semiconductor body 1. The trench 3 has a width of preferably at least 30 μm.

Figure 2B:
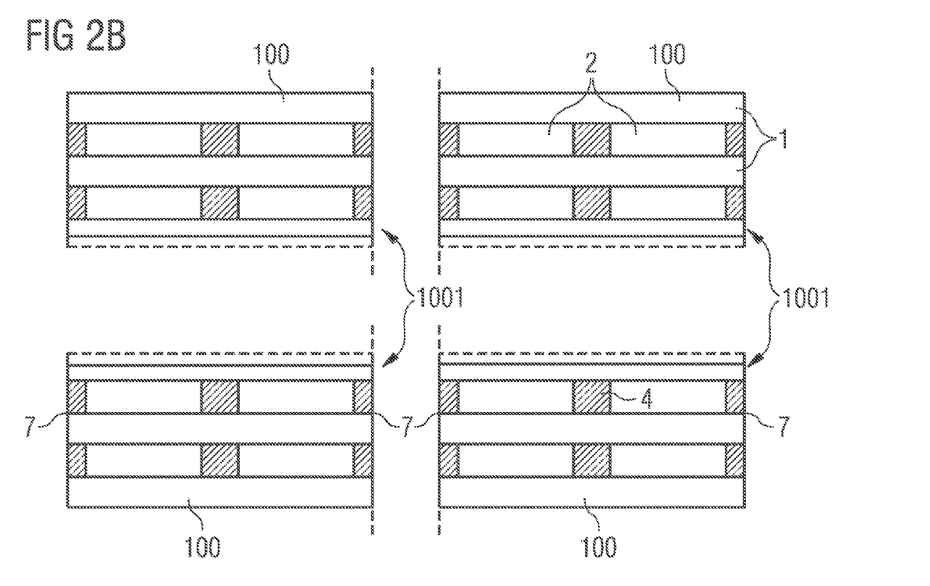

FIG. 2B shows a further step, in which the semiconductor body 1 is severed along the dividing lines 102 and 103 to yield individual edge-emitting semiconductor lasers 1001. Edge-emitting semiconductor lasers 1001 produced by severing exhibit four contact points 2 arranged in the manner of a matrix, i.e., on the outer face 11 two mutually spaced contact points 2 are arranged in each of the lateral direction 100 and the transverse direction 101. Singulation in each case forms two plane parallel facets 7 facing one another, which form the laser resonator 55. Such a "thin" total thickness, compared with the contact points, of the ohmic contact layer 4 with the wetting layer 12 prevents metallic residues arising for example through severing of the ohmic contact layer 4 and the wetting layer 12 from causing disturbances at the facets 7.

Figure 2C:
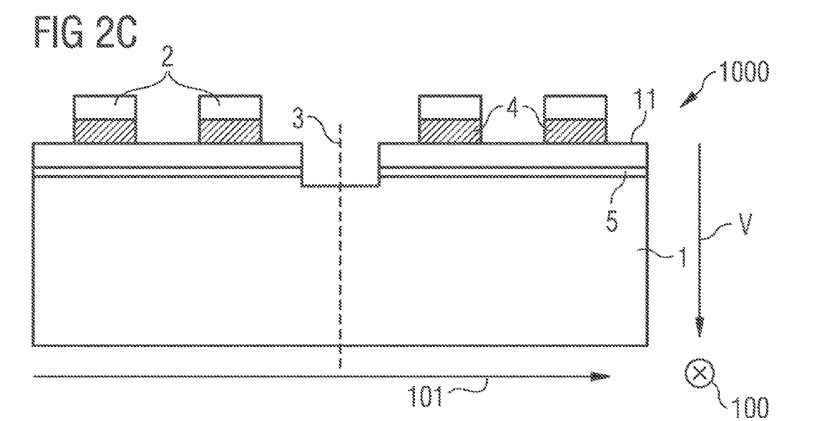

FIG. 2C shows the assembly 1000 of FIG. 1A in a schematic side view in the lateral direction 100. The trench 3 is introduced into the semiconductor body 1 between the contact points 2 arranged in the transverse direction 101, it being apparent from FIG. 2C that the trench 3 subdivides the active zone 5 in the transverse direction 101.

Figure 2D:
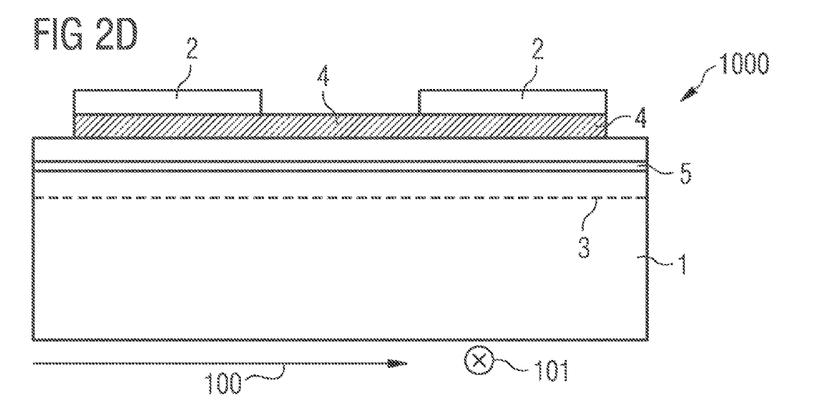

FIG. 2D shows the assembly 1000 in the direction of the transverse direction 101. The contact elements 2 spaced from one another in the lateral direction 100 and the active zone 5 continuous in the lateral direction 100 are again apparent.

Figure 2E:
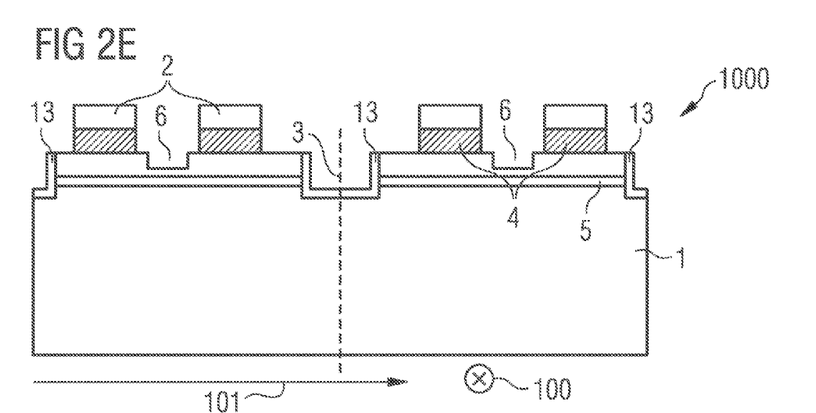

FIG. 2E shows the assembly 1000 likewise from the lateral direction 100, but with the structuring trenches 6 additionally introduced into the semiconductor body 1 between the contact points 2 adjoining one another in pairs, said structuring trenches not extending as far as the active zone 5, however. In other words, the structuring trenches 6 do not subdivide the active zone 5. Ridge lasers are formed by means of the structuring trenches 6 after severing of the semiconductor body 1. In addition, a passivation layer 13 is applied completely to free points of the semiconductor body 1 in the region of the trench 3. The passivation layer 13 may likewise be applied to further free points of the semiconductor body 1. After severing of the semiconductor body 1 along the trench 3, the steps 31 and 32 are for example formed in each semiconductor laser 1001.

The invention described herein is not restricted by the description given with reference to the exemplary embodiments. Rather, the invention encompasses any novel feature and any combination of features, including in particular any combination of features in the claims. This is the case even if this feature or this combination is not itself explicitly indicated in the claims or exemplary embodiments.

The invention claimed is:

1. An edge-emitting semiconductor laser, comprising:
   a semiconductor body, which comprises an active zone suitable configured to generate electromagnetic radiation;
   a plurality of contact points spaced from one another in a lateral direction by at least one intermediate zone, the contact points disposed on an outer face of the semiconductor body;
   a plurality of facets on the active zone, which form a resonator and which face one another in the lateral direction; and
   an ohmic contact layer comprising a metallic material arranged at least in places in a vertical direction between the contact points and the semiconductor body;
   wherein the ohmic contact layer is formed as at least one single stripe which extends continuously and contiguously along the lateral direction so that the at least one single stripe protrudes over the at least one intermediate zone and so that the contact points and the ohmic contact layer are superposable in a vertical direction at least in places.

2. The edge-emitting semiconductor laser according to claim 1, wherein the contact points are arranged in the manner of a matrix, the contact points being spaced from one another both in the lateral direction and in a transverse direction extending perpendicular to the lateral direction respectively by intermediate zones.

3. The edge-emitting semiconductor laser according to claim 1, further comprising a structuring trench in the semiconductor body in a region between contact points adjacent in a transverse direction that is parallel to the lateral direction, wherein, in the region of the structuring trench, parts of the semiconductor body are removed completely at least in places, wherein the structuring trench does not extend in a vertical direction as far as the active zone.

4. The edge-emitting semiconductor laser according to claim 1, wherein, with external energization of at least two contact points adjacent in the lateral direction, regions of the active zone not overlapping with the contact points in a vertical direction are energized with at least 0.3 times a maximum energization density of the active zone.

5. The edge-emitting semiconductor laser according to claim 1, wherein a spacing between two contact points adjacent in the lateral direction is at most a maximum lateral extent of the contact points.

6. The edge-emitting semiconductor laser according to the claim 1, wherein the ohmic contact layer comprises a material selected from the group consisting of Ti, Pt, Cr and Pd.

7. The edge-emitting semiconductor laser according to claim 1, further comprising a wetting layer applied, at least in places, to the ohmic contact layer.

8. The edge-emitting semiconductor laser according to claim 1, further comprising a passivation layer applied, at least in places, to at least one facet, wherein the passivation layer comprises a material selected from the group consisting of $SiO_2$, SiN, $TiO_2$, $Al2O_3$ and Si.

9. A method of producing an edge-emitting semiconductor laser, the method comprising:
   providing a semiconductor body, the semiconductor body comprising an active zone configured to generate electromagnetic radiation;
   placing an ohmic contact layer comprising a metallic material on an outer face of the semiconductor body, wherein the ohmic contact layer is formed by several single stripes which are separated from each other in a transverse direction in each case by an intermediate region, wherein the single stripes run continuously and contiguously in a lateral direction which extends transversely with respect to the transverse direction;
   forming a plurality of contact points on an outer face of the semiconductor body, the contact points being arranged, in the manner of a matrix and spaced from one another by intermediate zones both in the lateral direction and in the transverse direction so that the contact points and the ohmic contact layer are superposable in a vertical direction at least in places; and
   producing at least two facets on the active zone by severing the semiconductor body along severing lines extending in the transverse direction to yield individual edge-emitting semiconductor lasers, wherein the facets face one another in the lateral direction and wherein the severing lines do not extend through each of the intermediate zones.

10. The method according to claim 9, wherein the severing lines extend through every n-th intermediate zone, wherein n>1.

11. The method according to claim 9, wherein the contact points exhibit a spacing of at least 15 μm in the lateral direction.

12. The method according to claim 9, further comprising prior to severing, forming at least one trench introduced over the outer face of the semiconductor body between contact points adjacent in the transverse direction, parts of the semiconductor body being removed completely at least in places in a region of the trench and the trench subdividing the active zone in the transverse direction.

13. The method according to claim 12, wherein the semiconductor body is severed along the at least one trench to yield individual edge-emitting semiconductor lasers.

14. The method according to claim 9, wherein the method forms an edge emitting semiconductor laser comprising:
   a semiconductor body, which comprises an active zone suitable configured to generate electromagnetic radiation;
   a plurality of facets on the active zone, which form a resonator; and
   a plurality of contact points spaced from one another in a lateral direction by at least one intermediate zone, the contact points disposed on an outer face of the semiconductor body.

15. An edge-emitting semiconductor laser, comprising:
a semiconductor body, which comprises an active zone configured to generate electromagnetic radiation;
a plurality of contact points spaced from one another in a lateral direction by at least one intermediate zone, the contact points disposed on an outer face of the semiconductor body;
a plurality of facets on the active zone, which form a resonator and which face one another in the lateral direction; and
an ohmic contact layer comprising a metallic material arranged at least in places in a vertical direction between the contact points and the semiconductor body;
wherein the ohmic contact layer is formed as at least one single stripe, which extends continuously and contiguously along the lateral direction, so that the single stripe protrudes over the at least one intermediate zone and so that the contact points and the ohmic contact layer are superposable in a vertical direction at least in places; and
wherein the semiconductor body comprises steps which cut through the active zone and define and edge the active zone in a transverse direction perpendicular to the lateral direction, wherein the steps extend continuously and contiguously in the lateral direction.

16. The edge-emitting semiconductor laser according to claim 2, wherein the ohmic contact layer is formed by single stripes which are separated from each other in a transverse direction in each case by an intermediate region; and
wherein the single stripes run continuously and contiguously in a lateral direction so that the contact points and the ohmic contact layer are superposable in a vertical direction at least in places.

\* \* \* \* \*